United States Patent [19]

Schoenthaler

[11] Patent Number: 5,165,984
[45] Date of Patent: Nov. 24, 1992

[54] STEPPED MULTILAYER INTERCONNECTION APPARATUS AND METHOD OF MAKING THE SAME

[75] Inventor: David Schoenthaler, Yardley, Pa.

[73] Assignee: AT&T Bell Laboratories, Murray Hill, N.J.

[21] Appl. No.: 737,754

[22] Filed: Jul. 30, 1991

[51] Int. Cl.$^5$ .............................................. B32B 9/00
[52] U.S. Cl. ................................. 428/209; 428/210; 428/195; 428/688; 174/250; 361/397; 361/414
[58] Field of Search ............ 428/195, 220, 210, 209, 428/688; 174/250; 361/397, 414

[56] References Cited

U.S. PATENT DOCUMENTS 3,142,610 7/1964 Lowe ................................... 428/457
4,880,684 11/1989 Boss et al. .......................... 428/209

*Primary Examiner*—Patrick J. Ryan
*Assistant Examiner*—Cathy K. Lee
*Attorney, Agent, or Firm*—Robert B. Levy

[57] ABSTRACT

A stepped multilayer Printed Wiring Board (PWB) (10), having an increased number of wiring paths in selected regions, is comprised of a main multilayer PWB (12) having a sufficient number of layers ($12_1, 12_2, 12_3 \ldots 12_n$) to provide the lowest number of wiring paths required anywhere on the board. In regions where a larger number of wiring paths are required, a secondary, multilayer PWB section (22), having a sufficient number of layers ($22_1, 22_2, 22_3$) to provide the required additional number of wiring paths, is connected to the main PWB by a layer of anisotropically conductive material (30) sandwiched therebetween. A plurality of mechanical fasteners (33,33'), typically bifurcated or heat-staked plastic pins, extends through the secondary PWB section and the main PWB to hold one to the other.

9 Claims, 1 Drawing Sheet

STEPPED MULTILAYER INTERCONNECTION APPARATUS AND METHOD OF MAKING THE SAME

TECHNICAL FIELD

This invention relates to interconnection substrates and, more particularly, to printed wiring boards.

BACKGROUND OF THE INVENTION

The printed wiring board remains today as to the most common device for interconnecting electronic components to each other. Most present-day printed wiring boards are comprised of one or more layers of a glass epoxy or polyester material such as FR-4 or the like. On the exposed surfaces of one or both of the two outer layers of the printed wiring board is a pattern of metallization comprised of metallized component-receiving areas and metallized links. Some of the links may be connected to the component-receiving areas, which are adapted to receive a conductive member of a component for bonding thereto. Each intermediate layer also has a pattern of metallized links which run between metallized vias. Such vias electrically connect a metallized link on one layer to a selected link on an adjacent layer or to a component-receiving area on one of the outer layers. In this way, the links on the outer and intermediate layers to connect a pair of component-receiving layers so as to create a "wiring path" therebetween.

There is currently a trend towards increasing the density of circuits within active electronic components (i.e., integrated circuit devices) which has led to an increase in input/output connections that must be made to such components. The increase in input/output connections generally requires an increase in the number of wiring paths that must be provided between such components by the printed wiring board. The conventional approach to increasing the number of wiring paths provided by a given-size printed wiring board is to increase the number of layers and to reduce the linewidth of the metallized links on each layer. As a practical matter, the linewidth of the links cannot be reduced below a minimum level because of constraints associated with proper signal transmission, current carrying capability, and fabrication limitations. Once the linewidth of the links has been reduced to this minimum level, then any increase in the number of wiring paths must be accomplished by increasing the number of printed wiring board layers.

Unfortunately, increasing the number of layers of a printed wiring board greatly increases the board fabrication cost. Therefore, it is undesirable to fabricate a printed wiring board having more layers than are necessary to provide the requisite number of wiring paths. In many instances, the number of wiring paths required in certain regions of the printed wiring board is less than in other regions. However, there is currently no practical way to build printed wiring boards having varying numbers of layers in different regions. Therefore, each printed wiring board must be fabricated with a sufficient number of layers to provide the maximum number of wiring paths required anywhere on the board, thus resulting in high fabrication costs.

Thus, there is a need for a printed wiring board which provides for an increased number of wiring paths in selected regions of the board.

SUMMARY OF THE INVENTION

Briefly, in accordance with a preferred embodiment of the invention, a stepped multilayer interconnection apparatus comprises a primary interconnection substrate (e.g., a Printed Wiring Board (PWB)) having upper and lower outer layers and at least one intermediate layer. On the upper outer layer is a pattern of metallized component-receiving areas and metallized links. On each intermediate layer is at least one metallized link. Each link on each intermediate layer is connected to either a link on another layer, or to a metallized component-receiving area on an outer layer, by a metallized via. In this way, each of a pair of component-receiving areas is linked together by at least one link to establish a wiring path between the component-receiving areas.

Overlying the primary substrate is at least one secondary multilayer substrate section (e.g., a section of PWB) comprised of upper and lower outer layers and at least one intermediate layer. On the upper outer layer is a pattern of metallized component-receiving areas and metallized links. On the lower surface of the lower outer layer is a plurality of metallized connecting areas. On each intermediate layer is at least one metallized link. Each link is connected to a link on another layer or to either a metallized component-receiving or -connecting area by a metallized via. In this way, at least each of a pair of component-receiving areas is linked by at least a separate one of a pair of links to a separate one of a pair of metallized connecting areas on the lower outer layer.

A layer of anisotropically conductive material is interposed between each secondary interconnection substrate section and the primary interconnection substrate to electrically interconnect each metallized connecting area on the substrate section to a corresponding component-receiving area on the primary substrate. A plurality of mechanical fasteners extends through both the secondary interconnection substrate section and the primary interconnection substrate to hold one to the other so that the anisotropically conductive material remains compressed therebetween.

DETAILED DESCRIPTION

Figure 1:
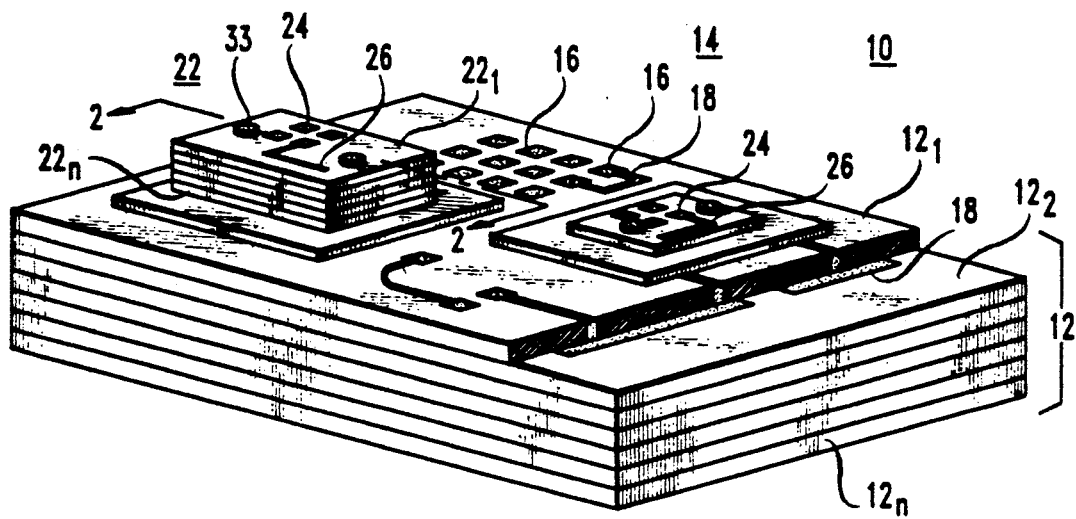
FIG. 1 is a perspective view of a stepped multilayer interconnection substrate in accordance with the invention.

FIG. 1 is a perspective view of a stepped multilayer interconnection apparatus 10 in accordance with the present invention. The apparatus 10 is comprised of a primary substrate 12, typically, a conventional printed wiring board formed of a plurality of layers $12_1$, $12_2$, $12_3$ ... $12_n$ of conventional printed circuit board materials such as glass epoxy material (FR-4) or the like. The substrate 12 could also be comprised of a polyimide or ceramic material, depending on the desired application. For ease of discussion, the layers $12_1$ and $12_n$ shall be referred to as the "outer" layers of the substrate 12, whereas the layers $12_2$, $12_3$, $12_4$ ... $12_{n-1}$ shall be referred to as the "intermediate layers." The total number of layers $12_1$, $12_2$, $12_3$ ... $12_n$ is selected to provide the least number of wiring paths required anywhere on the substrate 12, as will be described below.

Figure 2:
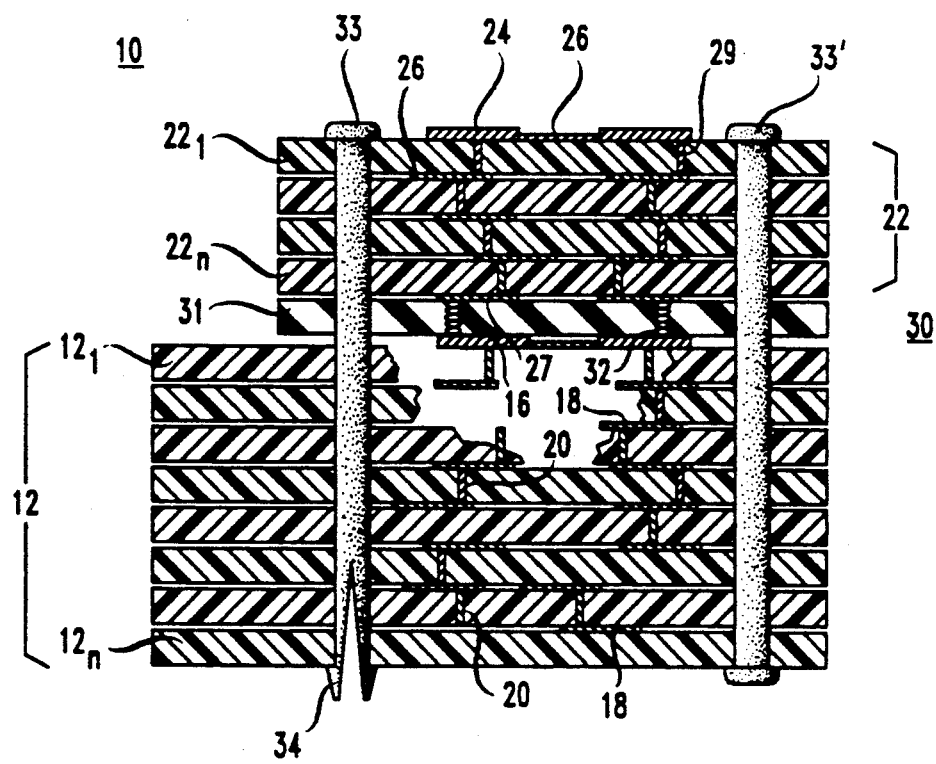
FIG. 2 is a cross-sectional view of the stepped multilayer interconnection substrate of FIG. 1 taken along the plane 2—2 thereof.

As best seen in FIG. 1, on one or both of the outer layers $12_1$ and $12_n$ of the primary substrate 12 is a pattern of metallization 14 comprised of metallized component-receiving areas 16 and metallized links 18. In the illustrated embodiment, the component-receiving areas 14 take the form of metallized pads, each adapted for solder bonding to a conductive member of a surface mount component (not shown). As may be appreciated, the component-receiving areas 14 could alternatively take the form of metallized through-holes (not shown) for receiving the leads of a through-hole component (not shown). As seen in FIG. 2, each of the intermediate layers $12_2, 12_3, 12_4 \ldots 12_{n-1}$ also has at least one, and preferably, a plurality of metallized links 18 thereon. Each component-receiving area 16 is connected, either directly to a link 18 on the surface $12_1$ or by a metallized via 20 to a link on another layer. At least one link 18 on each intermediate layer is connected by a metallized via 20 to a link on another layer. In this way, at least one component-receiving area 16 on a major (e.g., outer) substrate surface is selectively connected to another area through one or more of the links 18 on one or more of the substrate layers $12_1, 12_2, 12_3 \ldots 12_n$ to create a wiring path between a pair of components (not shown) mounted to one of the major surfaces of the substrate 12.

A conventional printed wiring board (not shown) would typically be fabricated so as to have a sufficient number of layers to provide the maximum number of wiring paths needed anywhere on the board. In contrast, the primary substrate 12 comprises a conventional printed wiring board except that the primary substrate of the invention contains a substantially reduced number of layers sufficient to provide the number of wiring paths required over most of the area of the substrate.

In accordance with the invention, the number of layers $12_1, 12_2, 12_3 \ldots 12_n$ on the substrate 12 can be effectively increased in selected regions of the substrate by the addition of individual, secondary, multilayer interconnection substrate sections 22 (only two of which are shown). Each secondary substrate section 22 typically comprises a small portion of a multilayer interconnection substrate made from the same materials as the primary substrate 12. Thus, in the preferred embodiment, where the primary substrate 12 comprises a printed wiring board, each secondary substrate section 22 comprises a section of a printed wiring board fabricated from a plurality of layers $22_1, 22_2, 22_3 \ldots 22_n$ of printed wiring board material. As best seen in FIG. 1, on the exposed surface of the uppermost layer $22_1$ of the secondary substrate section 22 is a pattern of metallized component-receiving areas 24 and links 26, similar in nature to (although not necessarily arranged the same as) the metallized component-receiving areas 16 and links 18, respectively, on the surface of the layer $12_1$ of the substrate 12. As best seen in FIG. 2, on the lower surface of the lower outer layer $22_n$ is a pattern of metallized connecting areas 27.

Referring to FIG. 2, each of the layers $22_2, 22_3 \ldots 22_{n-1}$ also has at least one, and preferably a plurality of metallized links 26 thereon. Each link 26 on each of the intermediate layers $22_2, 22_3 \ldots 22_{n-1}$ is connected by a metallized via 29 to either a link on another layer or to a separate one of the metallized component-receiving or -connecting areas 24 or 27, respectively. In this way, each component-receiving area 24 is connected by at least one link 26 to a connecting area 27.

A layer of anisotropically conductive material 30 is sandwiched between the lower layer $22_n$ of the secondary substrate section 22 and the upper surface of the layer $12_1$ of the primary substrate 12 to interconnect each of the metallized connecting areas 27 to corresponding metallized, component-receiving areas 16. The anisotropically conductive material layer 30 generally takes the form of an insulative matrix 31, formed of a slab of silicone rubber, resin, or a nonconductive adhesive. Mixed within the matrix 31 is a plurality of conductive particles 32 (e.g., metallized flakes, wires or spheres). The particles 32 are arranged in columns so as to extend between each of a pair of major surfaces of the matrix 31 for making an electrical contact with a separate one of the metallized connecting areas 27 and component-receiving areas 16 on the layers $22_n$ and $12_1$, respectively. Since the matrix 31 is itself non-conductive, there is no cross-conductivity between the columns of particles 32.

The anisotropically conductive material layer 30, when fabricated from a matrix of silicone rubber, is most effective when slightly compressed. To that end, a plurality of mechanical fasteners, each typically taking the form of pin 33 or 33' extends through the secondary substrate 22 and the primary substrate 12 to hold one to the other so that the anisotropically conductive layer 30 is compressed. In the illustrated embodiment, the pin 33 takes the form of a plastic "bifurcated" pin whose central portion is split to allow each of a pair of projections 34, at the lowermost pin end, to engage the bottom outer layer $12_n$ while the pin head engages the substrate section 22. Pin 33' takes the form of a plastic pin heat-staked to the secondary substrate section 22 and the primary substrate 12. It should be appreciated that other types of pins, or even other types of mechanical fasteners, made from plastic or other materials, could be employed.

The foregoing discloses a stepped multilayer interconnection substrate 10 comprised of a primary multilayer substrate 12 to which one or more separate, secondary substrate sections 22 are each connected by a layer of anisotropically conductive material 30 and are held in place by fasteners 33 and/or 33'. The advantage achieved by this approach is that the primary substrate 12 can be fabricated from a smaller number of layers that would otherwise be required to afford the requisite number of wiring paths. Yet, the required number of paths can be indeed obtained inexpensively, in regions where needed, by adding secondary multilayer interconnection substrate sections 22, and connecting them to the primary substrate 12 with the layer of anisotropically conductive material 30. Another advantage of the multilayer interconnection substrate 10 is that a repair, necessitated by a defect, such as a broken or mis-registered link 26, within the substrate section 22 can be easily undertaken by simply shearing the pins 33/33' and replacing the section. In contrast, should a metallized link on an intermediate layer of conventional multilayer printed wiring board be broken, mis-registered, or otherwise defective, the entire board must be discarded.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A stepped multilayer interconnection apparatus comprising:
   a primary multilayer interconnection substrate having upper and lower outer layers and at least one intermediate layer therebetween, at least one outer layer having a plurality of first metallized component-receiving areas and first metallized links thereon, each intermediate layer having at least one first metallized link thereon and at least one first metallized via for connecting the first link so that at least one of the first links on at least one layer provides at least a portion of an electrical connection between a pair of component-receiving areas on an outer layer to establish a wiring path therebetween;
   at least one secondary multilayer interconnection substrate section of an area less than the primary substrate, the secondary substrate having an upper and lower outer layer and at least one intermediate layer therebetween, the upper outer layer having second metallized component-receiving areas and second metallized links thereon, the lower outer layer having metallized connecting areas thereon and each intermediate layer having at least one second metallized link thereon and at least one second metallized via for connecting the second link so that at least one of the second links on at least one layer of said secondary substrate section provides at least a portion of an electrical connection between a second component-receiving area and a metallized connecting area;
   a layer of anisotropically conductive material interposed between the primary substrate and each secondary substrate section for connecting each metallized connecting area on the lower outer layer of each secondary substrate section to a separate one of the first metallized component-receiving areas on the upper outer layer of the primary substrate; and
   a plurality of fasteners each extending through each secondary substrate section and the primary substrate to secure one to the other.

2. The article according to claim 1 wherein the primary substrate has plurality intermediate layers, which, in combination with the outer layers, yields a requisite number of wiring paths everywhere throughout the substrate.

3. The article according to claim 1 wherein each secondary substrate section has a plurality of layers so that, when connected to the primary substrate, the combined number of layers of the primary substrate and secondary substrate sections yields a requisite number of wiring paths.

4. The article according to claim 1 wherein each of the outer and intermediate layers of the primary interconnection substrate is comprised of printed wiring board material.

5. The article according to claim 1 wherein each of the outer and intermediate layers of each secondary interconnection substrate section is comprised of printed wiring board material.

6. The article according to claim 1 wherein each fastener is comprised of a bifurcated pin.

7. The article according to claim 1 wherein each fastener comprises a heat-staked plastic pin.

8. A stepped multilayer interconnection substrate obtained by the steps of:
   providing a primary multilayer interconnection substrate having a plurality of first metallized areas on at least one of its major surfaces;
   placing a layer of anisotropically conductive material onto the major surface of the primary substrate to overlie at least some of the metallized first areas thereon;
   placing a secondary multilayer interconnection substrate of an area smaller than the primary substrate and having a plurality of second metallized areas on at least one of its major surfaces, in face-to-face contact with the layer of anisotropically conductive material so that each of a plurality of first metallized areas on the primary substrate is electrically connected through the anisotropically conductive material to a separate one of the plurality of second metallized areas on the secondary substrate section; and
   securing the secondary substrate section to the primary substrate by a plurality of mechanical fasteners extending therebetween.

9. The article according to claim 8 wherein the secondary substrate section is secured to the primary substrate by heat-staking a plastic pin extending therebetween.

* * * * *